United States Patent

Miyauchi et al.

[11] Patent Number: 5,160,405
[45] Date of Patent: Nov. 3, 1992

[54] METHOD OF ETCHING DIAMOND THIN FILMS

[75] Inventors: Shigeaki Miyauchi; Koichi Miyata; Kazuo Kumagai, all of Kobe; Koji Kobashi, Nishinomiya, all of Japan

[73] Assignee: Kabushiki Kaisha Kobe Seiko Sho, Kobe, Japan

[21] Appl. No.: 670,590

[22] Filed: Mar. 18, 1991

[30] Foreign Application Priority Data

Mar. 19, 1990 [JP] Japan .................. 2-71672

[51] Int. Cl.$^5$ ........................... H01L 21/00
[52] U.S. Cl. ..................... 156/643; 156/646; 204/192.32
[58] Field of Search ............ 156/643, 646; 204/192.32, 298.33, 298.36

[56] References Cited

U.S. PATENT DOCUMENTS

| | | | |
|---|---|---|---|
| 4,081,314 | 3/1978 | Smith | 156/663 |
| 4,273,561 | 6/1981 | Fernandez-Moran | 505/825 |
| 4,452,679 | 6/1984 | Dunn et al. | 204/165 |
| 4,496,449 | 1/1985 | Rocca et al. | 204/298.36 |
| 4,891,120 | 1/1990 | Setti et al. | 204/299 R |
| 4,925,701 | 5/1990 | Jansen et al. | 427/38 |
| 4,957,591 | 9/1990 | Sato et al. | 156/643 |
| 4,980,021 | 12/1990 | Kitamura et al. | 156/643 |

FOREIGN PATENT DOCUMENTS 63-220524  9/1988  Japan .
63-237531 10/1988  Japan .

*Primary Examiner*—David A. Simmons
*Assistant Examiner*—George Goudreau
*Attorney, Agent, or Firm*—Oblon, Spivak, McClelland, Maier & Neustadt

[57] ABSTRACT

Described is an etching method of a diamond film which comprises providing a diamond film in an atmosphere of a gas containing at least oxygen and/or hydrogen and subjecting the diamond film to an irradiation of an electron beam generated by direct current discharge through a pattern of a mask. In this condition, when the diamond film is contacted with the plasma produced by the electron beam in the atmosphere, the unmasked areas are irradiated by the electron beam, and converted to graphite. The graphite is more readily etched by the plasma, so that the diamond film can be etched at a high rate. The etching through a mask ensures a fine etched pattern of the diamond film. In addition, a diamond film with a large area can be etched by this method.

12 Claims, 3 Drawing Sheets

METHOD OF ETCHING DIAMOND THIN FILMS

BACKGROUND OF THE INVENTION

1. Field of the Invention

This invention relates to the art of etching diamond films which are used as a novel material for semiconductors and optics.

2. Description of Prior Art

For the purpose of application to semiconductors and optics, many attempts have been made to establish an etching technique of diamond films. Known etching methods of diamond films which have been heretofore reported include methods (1) and (2) described below.

(1) A microwave plasma chemical vapor deposition (CVD) apparatus of diamond as shown in FIG. 4 is used, where a diamond films 10 deposited on a substrate 11 is set in a reaction chamber 9 and is irradiated and etched with a plasma generated by the microwave in an atmosphere of oxygen or air at a pressure of 10 to 40 Torr. This method (hereinafter referred to as prior method 1) is described in NEW DIAMOND, Vol. 5, No. 1, P. 12 (1989).

(2) Another method is schematically shown in FIG. 5, where cathodes 13 and 14 are provided near a cylindrical anode 12 at the opposite ends and a magnetic field is applied parallel to the center line of the anode 12, under which a DC discharge (Penning discharge) is performed in an atmosphere of argon at a pressure of $10^{-2}$ Pa thereby producing an Ar ion beam, followed by an irradiation on a diamond film 16 through a hole 15 provided at the cathode 13. Reference numeral 17 indicates a substrate for the diamond film and reference numeral 18 indicates a mask. This method (hereinafter referred to as prior method 2) is described in NEW DIAMOND, Vol. 5, No. 2, P.40 (1989).

In the prior method 1, the microwave discharge is utilized, which places a restriction on a diameter of the resultant plasma to be less than 3 cm, and it is difficult to further enlarge the etching area. In addition, no microfabrication such as patterning has been reported using this method 1.

In the prior method 2, a discharge in the vicinity of the anode is utilized, so that it is difficult to etch a large area. Furthermore, since the diamond film is placed in the vicinity of the cathode, it is possible that the cathode (metal) material contaminates the diamond film surface. Such a film cannot be used for electronic devices in which the incorporation of impurities is most unfavorable.

SUMMARY OF THE INVENTION

It is accordingly an objective of the present invention to provide a new etching method of diamond films in a large area.

It is another objective of the invention to provide an etching method of diamond films to form a fine pattern or circuit on the order of a few micrometers in size.

It is a further objective of the invention to provide an etching method of diamond films at a higher rate than in prior art techniques so that the productivity by etching of diamond films can be significantly improved.

The above objectives can be achieved, according to the invention, by the etching method of diamond films which comprises:

providing a diamond film in an atmosphere of a gas containing at least oxygen and/or hydrogen;

subjecting the diamond films to an irradiation by an electron beam generated by direct current discharge through a pattern of a mask; and contacting the diamond film with the plasma produced by the action of the electron beam in the above stated atmosphere whereby the unmasked areas of the diamond film is etched.

DETAILED DESCRIPTION AND EMBODIMENTS OF THE INVENTION

Figure 1:
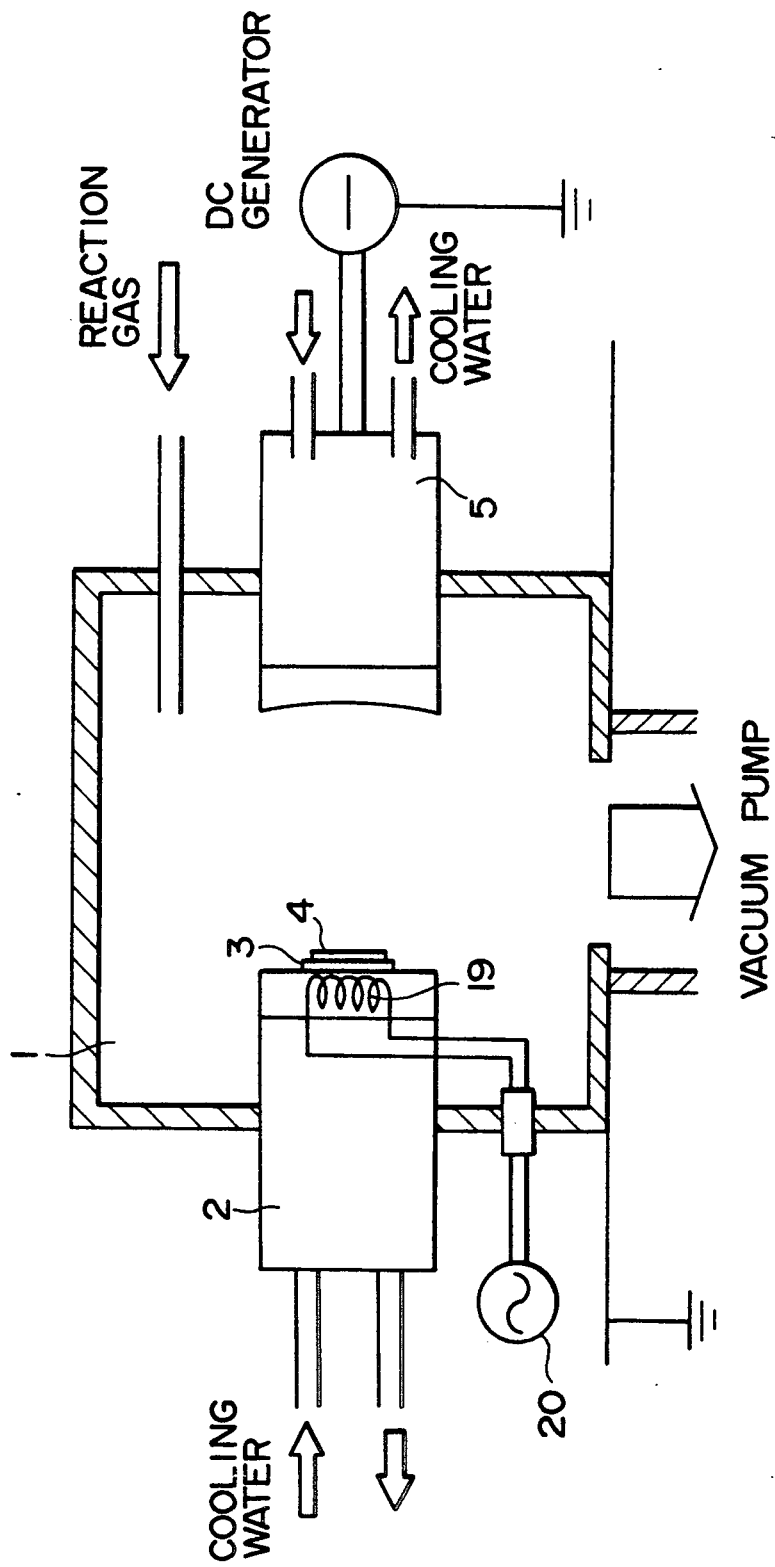
FIG. 1 is a schematic view of the etching apparatus of diamond films used in Example 1.

The etching method of diamond films according to the invention comprises, as described above, providing a diamond film in an atmosphere of a gas containing at least oxygen and/or hydrogen, and subjecting the diamond film to an irradiation by an electron beam generated by direct current discharge through a pattern of a mask.

In general, the diamond film is placed between electrodes in the atmosphere of the gas, and a DC voltage is applied between the electrodes to generate a plasma. Alternatively, the diamond film can be supported on the anode.

The electron beam is irradiated on the diamond film through a mask pattern formed on the diamond film and, at the same time, a plasma produced by the electron beam in the atmosphere is contacted with the diamond film. Consequently, the irradiated areas of the diamond film are graphitized by the electron beam. The contact of the graphitized areas with the plasma causes gasification reactions of the graphite and thus the diamond film is etched at a high rate. The major gasification reaction is an oxidation reaction: $C+O_2 \rightarrow CO_2$ when an oxygen-containing gas is used as the atmospheric gas, and a hydrogenation reaction: $C+2H_2 \rightarrow CH_4$ when a hydrogen-containing gas is used as the atmospheric gas.

Both reactions take place when an oxygen and hydrogen mixed gas is used.

Such reactions take place only at the unmasked, irradiated areas, so that the film is etched according to the mask pattern. The graphitisation of diamond by the electron beam makes the gasification reaction velocity high. The electron beam heats the diamond film and this also contributes to an increase in the gasification reactions.

The diameter of the electron beam can be increased simply by increasing a diameter of the electrodes which are designed to have a round form although any other form may be used. Therefore, the etching area can be readily increased.

The diamond film is protected from the electron beam and the plasma by a mask when the mask is formed directly on the diamond film. Thus, the areas covered with the mask are not etched. The mask material can be deposited on the diamond film by known semiconductor device fabrication techniques. Since a pattern on the order of micrometers can be formed on the diamond film. A very fine etching for a formation of patterns or circuits of diamond film is possible.

The oxygen or/and hydrogen-containing gas can contain helium because it has an effect of stabilizing the discharge.

The atmospheric pressure should preferably be controlled in the range of 0.01 to 5 Torr. At a pressure lower than 0.01 Torr, it is difficult to generate a plasma, and over 5 Torr, the discharge becomes unstable.

The diamond film should preferably be maintained at a temperature between 200° and 1000° C. during the etching. At temperatures lower than 200° C., the etching reaction is difficult to occur. Over 1000° C, the etching rate of the diamond film is abruptly increased, and difficult to control.

The mask should be provided in contact with the diamond film. The mask should preferably be made of metals or ceramics having corrosion and head resistances to the etching gas at a temperature of 200° to 1000° C.

The present invention is more particularly described by way of examples.

EXAMPLE 1

An etching apparatus of diamond films used in Example 1, which is particularly suitable for carrying out the method of the invention is schematically shown in FIG. 1.

The apparatus includes a reaction chamber 1 having a pair of electrodes 2 and 5 in a spaced relation to each other. The Electrode 2 can be grounded. Each electrode is cooled by means of cooling water as shown in FIG. 1. The electrode 2 is attached with a substrate 3 having a diamond film 4 on the substrate 3. The electrode 2 has a heater 19 connected to a power supply 20 in order to keep the substrate at a desired temperature. The chamber 1 can be evacuated and has a port for a reaction gas as shown in the figure.

In operation, a diamond film 4 deposited on the substrate 3 is set in the reaction chamber 1 as attached to the electrode 2.

Figure 2:
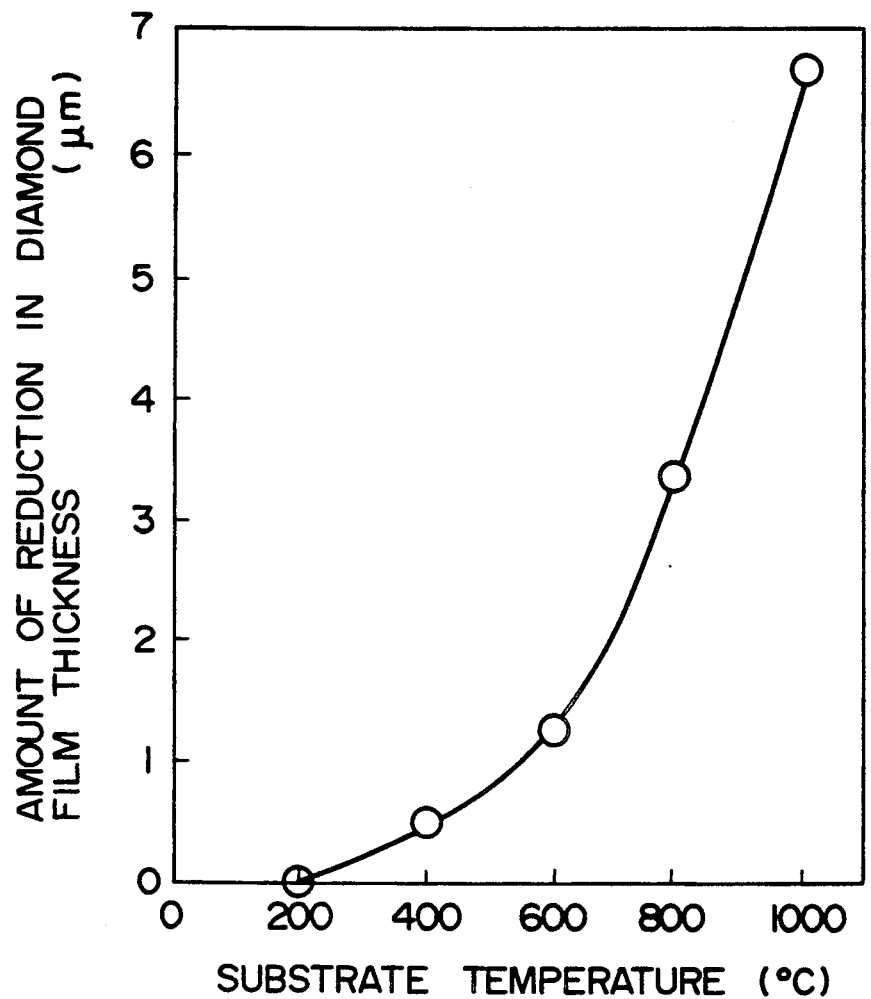
FIG. 2 is a graph showing a relationship between the substrate temperature and the reduction in thickness of diamond films in Example 1.

In this example, a voltage from a high voltage power source is applied between electrodes 2 and 5 in an atmosphere of a mixed gas consisting of 10 vol% of oxygen and with a helium balance (pressure: 0.9 Torr), and an electron beam generated by DC discharge is irradiated on the diamond film 4, whereupon the atmospheric gas is converted to a plasma. Accordingly, the diamond film 4 is etched over the entire surface. The temperature of the substrate 3 is fixed by means of the heater 19 to determine the relationship between the temperature and the degree of etching (a reduction in thickness of the diamond film). As a result, it was found that, as shown in FIG. 2, a higher substrate temperature leads to a higher rate of etching.

EXAMPLE 2

Figure 3:
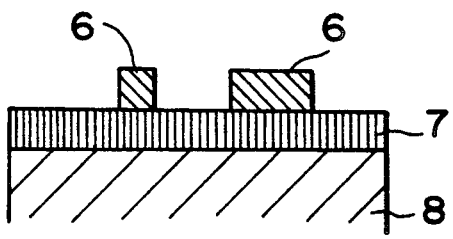
FIG. 3 is a schematic sectional view of a diamond film having a gold thin film pattern and formed on a silicon substrate which is used for illustration in Example 2.
Figure 4:
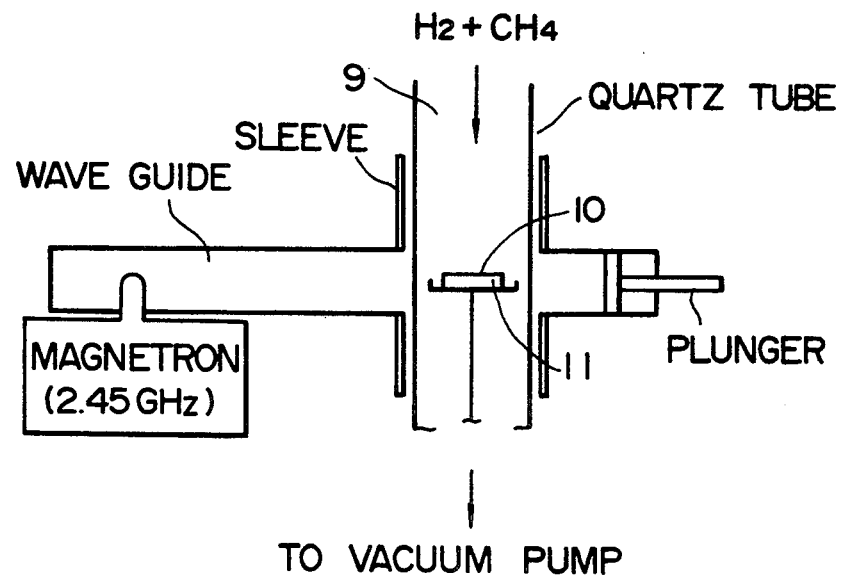
FIG. 4 is a schematic view of a microwave plasma chemical vapor deposition apparatus using in a prior art method.
Figure 5:
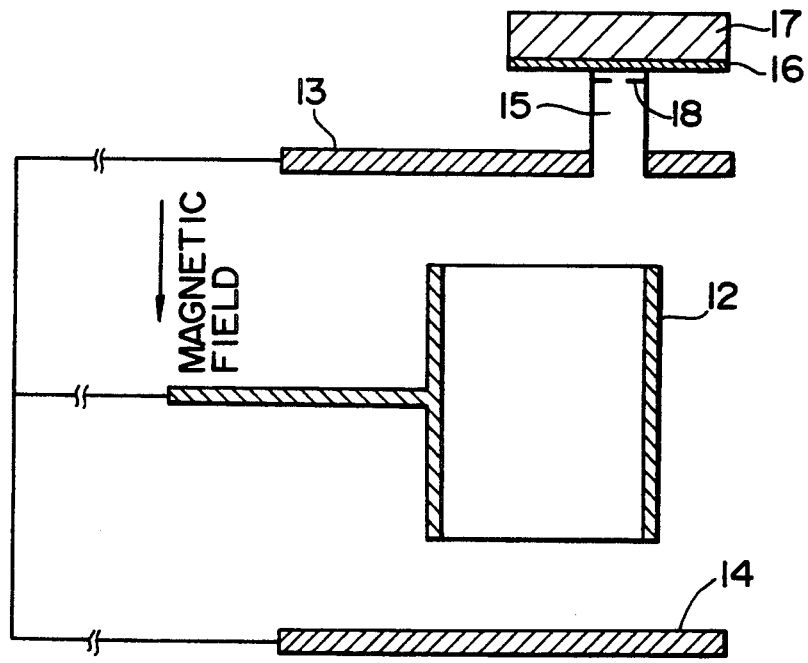
FIG. 5 is a view illustrating an etching method using an ion beam system according to a prior art method.

As shown in FIG. 3, a diamond film 7 was formed on a silicon substrate 8 in a thickness of 5 μm, after which a pattern of a 4000 angstrom thick gold thin film 6 was formed on the thin film 7 in different widths of 5 to 20 μm for use as a mask using the standard lithography technique. Thereafter, the film was etched in the same manner as in Example 1 using the same apparatus as in Example 1. The substrate temperature was set at 800° C.

After the etching, the gold thin film (mask) was dissolved out with use of an etching solution. As a result, a diamond film pattern having widths of 5 to 20 μm was obtained according to the gold film pattern.

EXAMPLE 3

Etching was effected in a similar manner as in Example 2 except that hydrogen gas was used as an atmospheric gas. As a result, a diamond film having an intended pattern was obtained.

EXAMPLE 4

Etching was effect in the similar manner as in Example 2 except that a mixed gas consisting of 10 vol% of oxygen and 90 vol% of hydrogen was used. As a result, a diamond film having an intended pattern was obtained.

What is claimed is:

1. An etching method of diamond films which comprises the steps of:
    providing a masked diamond film in an atmosphere of a gas containing at least one member of the group consisting of oxygen and hydrogen;
    subjecting the diamond film to an irradiation by an electron beam generated by a DC discharge through a pattern of the mask; and
    contacting the diamond film with a plasma produced by the action of the electron beam in said atmosphere of a gas, whereby unmasked areas of the diamond film are etched.

2. The etching method according to claim 1, wherein the electron beam is generated by application of a voltage between electrodes, and
    placing the diamond film between the electrodes.

3. The etching method according to claim 2, wherein the diamond film is attached to one of the anode and the grounded electrode.

4. The etching method according to claim 2, wherein the electrodes have surfaces that oppose one another, the electron beam being generated in a region between the opposing surfaces, said region having cross-sections of roughly the same dimensions as the opposing surfaces, wherein diamond in said region is etched.

5. The etching method according to claim 1, wherein said gas contains helium.

6. The etching method according to claim 1, wherein said atmosphere is controlled at a pressure between 0.01 and 5 Torr.

7. The etching method according to claim 1, wherein said diamond film is at a temperature between 200 and 1000° C.

8. The etching method according to claim 1, wherein the mask is made of a ceramic material having corrosion and heat resistances to said gas at a temperature between 200 and 1000° C.

9. A method of etching a masked diamond film, comprising the steps of:
    providing a masked diamond film, wherein said mask covers first regions of the diamond film and leaves second regions of the diamond film uncovered;
    surrounding said masked diamond film with a gas containing at least one member of the group consisting of oxygen and hydrogen;
    irradiating said masked diamond film with an electron beam, wherein said beam is generated by a DC discharge;

producing a plasma in the gas through action of the electron beam on the gas; ad contacting the plasma with said masked diamond film, whereby said second regions of the diamond film are etched.

10. A method according to claim 9 wherein, said electron beam is generated by electrodes that have predetermined dimensions, thereby providing an etching area corresponding to said predetermined dimensions.

11. A method of etching a diamond film, comprising the steps of:

providing a diamond film;

surrounding said diamond film with a gas containing at least one member of the group consisting of oxygen and hydrogen;

irradiating said diamond film with an electron beam, wherein said beam is generated by a DC discharge;

producing a plasma in the gas through action of the electron beam on the gas; and contacting the diamond film with said plasma.

12. A method according to claim 1, wherein the mask is made of a metal having corrosion and heat resistance to said gas at a temperature between 200 and 1,000° C.

* * * * *